(12) United States Patent
Hagi

(10) Patent No.: US 7,473,317 B2
(45) Date of Patent: Jan. 6, 2009

(54) CRYSTAL GROWTH CRUCIBLE

(75) Inventor: Yoshiaki Hagi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/884,836

(22) PCT Filed: Mar. 9, 2006

(86) PCT No.: PCT/JP2006/004562

§ 371 (c)(1),
(2), (4) Date: Aug. 22, 2007

(87) PCT Pub. No.: WO2006/100927

PCT Pub. Date: Sep. 28, 2006

(65) Prior Publication Data

US 2008/0127885 A1    Jun. 5, 2008

(30) Foreign Application Priority Data

Mar. 23, 2005 (JP) .............................. 2005-084402

(51) Int. Cl.
*C30B 35/00* (2006.01)
(52) U.S. Cl. .................. 117/200; 117/209; 117/900
(58) Field of Classification Search ................ 117/200, 117/209, 900
See application file for complete search history.

(56) References Cited

FOREIGN PATENT DOCUMENTS

| EP | 0 744 476 B1 | 11/1996 |
|----|---|---|
| EP | 0 803 593 B1 | 10/1997 |
| JP | 04-367583 | 12/1992 |
| JP | 08-048591 | 2/1996 |
| JP | 8-48591 | 2/1996 |
| JP | 2004-026577 | 1/2004 |
| JP | 2004-277266 | 10/2004 |

OTHER PUBLICATIONS

European Search Report, issued in European Patent Application No. 06715433.6-1215, dated on Mar. 6, 2008.

*Primary Examiner*—Felisa C Hiteshew
(74) *Attorney, Agent, or Firm*—McDermott Will & Emery LLP

(57) ABSTRACT

A crystal growth crucible made of boron nitride includes a cylindrical tip portion for accommodating a seed crystal, and a cylindrical straight-body portion for growing a crystal, which is formed above the tip portion and has a diameter larger than that of the tip portion. Thickness T1 of the tip portion and thickness T2 of the straight-body portion satisfy a condition of $0.1 \text{ mm} \leq T2 < T1 \leq 5 \text{ mm}$, and inside diameter D2 and length L2 of the straight-body portion satisfy conditions of $100 \text{ mm} < D2$ and $2 < L2/D2 < 5$.

4 Claims, 7 Drawing Sheets

(A) SINGLE-CRYSTAL PRODUCTION APPARATUS (B) TEMPERATURE PROFILE

CRYSTAL GROWTH CRUCIBLE

This application is the U.S. National Phase under 35 U.S.C. § 371 of International Application No. PCT/JP2006/304562, filed on Mar. 9, 2006, which in turn claims the benefit of Japanese Application No. 2005-084402, filed on Mar. 23, 2005, the disclosure of which Application is incorporated by reference herein.

TECHNICAL FIELD

The present invention relates to a crystal growth crucible and particularly to a crystal growth crucible for producing a single crystal of a compound semiconductor.

BACKGROUND ART

As conventional methods of growing a single crystal, there are known an HB (Horizontal Bridgman) method, a GF (Gradient Freeze) method, a VB (Vertical Bridgman) method, a VGF (Vertical Gradient Freeze) method, a VZM (Vertical Zone Melt) method and the like. In each of these methods, a seed crystal is placed at a part of a boat or a crucible in which a source melt is brought in contact with the seed crystal, and temperature of the melt is gradually lowered on the seed crystal side so as to grow a single crystal. Particularly in the VB method and the VGF method, it is possible to use a cylindrical crucible as shown in Japanese Patent Laying-Open No. 04-367583 (Patent Document 1) and Japanese Patent Laying-Open No. 08-048591 (Patent Document 2).

FIG. 6 is a schematic cross-sectional view showing an exemplary crucible for use in the conventional VB method. A crucible 11 includes a crucible tip portion 3 for accommodating a seed crystal 2, a straight-body portion 5 for growing a crystal product having a diameter larger than that of tip portion 3, and a shoulder portion 4 connecting crucible tip portion 3 and straight-body portion 5. When a compound semiconductor crystal is to be grown, boron nitride is used as a material of the crucible. In an actual procedure of crystal growth, a production apparatus as described below is used with such a crucible.

FIG. 7(A) is a schematic block diagram showing an exemplary crystal production apparatus, while FIG. 7(B) is a graph showing a temperature profile in the apparatus. In the crystal production apparatus of FIG. 7(A), a crucible 11 is set on a crucible installation portion 8 provided at the center of an airtight container 6. Heating portions 7 are provided around crucible 11. Heating portions 7 are controlled to create a temperature profile including a temperature gradient as shown in FIG. 7(B). Under relative movement of the temperature profile, a source is melted to be in contact with a seed crystal and then solidified to grow a single crystal.

In Japanese Patent Laying-Open No. 08-048591, each of the thicknesses and the inside diameters of the tip portion and the straight-body portion of the crystal growth crucible is adjusted within a certain range such that temperature difference in a radial direction of the crystal (between central part and outer peripheral part) during crystal growth is reduced so as to suppress thermal strain and generation of dislocations (crystal defects).

Patent Document 1: Japanese Patent Laying-Open No. 04-367583

Patent Document 2: Japanese Patent Laying-Open No. 08-048591

DISCLOSURE OF THE INVENTION

Problems to be Solved by the Invention

Even in the case that each of the thicknesses and the inside diameters of the tip portion and the straight-body portion of the crystal growth crucible is adjusted within a certain range as in the prior art, however, adjustments of only the thicknesses and the ratio of the inside diameters between the tip portion and the straight-body portion of the crucible are not so effective in suppressing generation of dislocations and it becomes difficult to grow a crystal of a low dislocation density when a large-caliber crucible is used to grow a compound semiconductor single crystal of a large diameter as especially demanded in recent years.

In view of such a problem, an object of the present invention is to provide a crystal growth crucible in which a crystal can be grown with a low dislocation density even when a large-diameter crystal is to be grown.

Means for Solving the Problems

A crystal growth crucible made of boron nitride according to the present invention includes: a cylindrical tip portion for accommodating a seed crystal; and a cylindrical straight-body portion for growing a crystal, which is formed above the tip portion and has a diameter larger than that of the tip portion. Thickness $T_1$ of the tip portion and thickness $T_2$ of the straight-body portion satisfy a condition of $0.1 \text{ mm} \leq T_2 < T_1 \leq 5 \text{ mm}$, and inside diameter $D_2$ and length $L_2$ of the straight-body portion satisfy conditions of $100 \text{ mm} < D_2$ and $2 < L_2/D_2 < 5$.

It is preferable that thickness $T_1$ of the tip portion and thickness $T_2$ of the straight-body portion further satisfy conditions of $T_1 \leq 0.9 \text{ mm}$ and $T_2 \leq 0.6 \text{ mm}$. Furthermore, it is preferable that inside diameter $D_1$ of the tip portion and inside diameter $D_2$ of the straight-body portion satisfy a condition of $1/20 \leq D_1/D_2 \leq 1/5$. Furthermore, it is preferable that inside diameter $D_1$ of the tip portion and outside diameter $S_1$ of the seed crystal satisfy a condition of $0.01 \text{ mm} \leq D_1 - S_1 \leq 1 \text{ mm}$ at a room temperature.

Effects of the Invention

According to the present invention described above, it is possible to obtain a crystal having a large diameter and a low dislocation density as compared with the conventional one, by using a crystal growth crucible in which the thicknesses, the inside diameters, the lengths and the like of the tip portion and the straight-body portion are adjusted in the prescribed ranges and relations.

DESCRIPTION OF THE REFERENCE SIGNS

Figure 1:
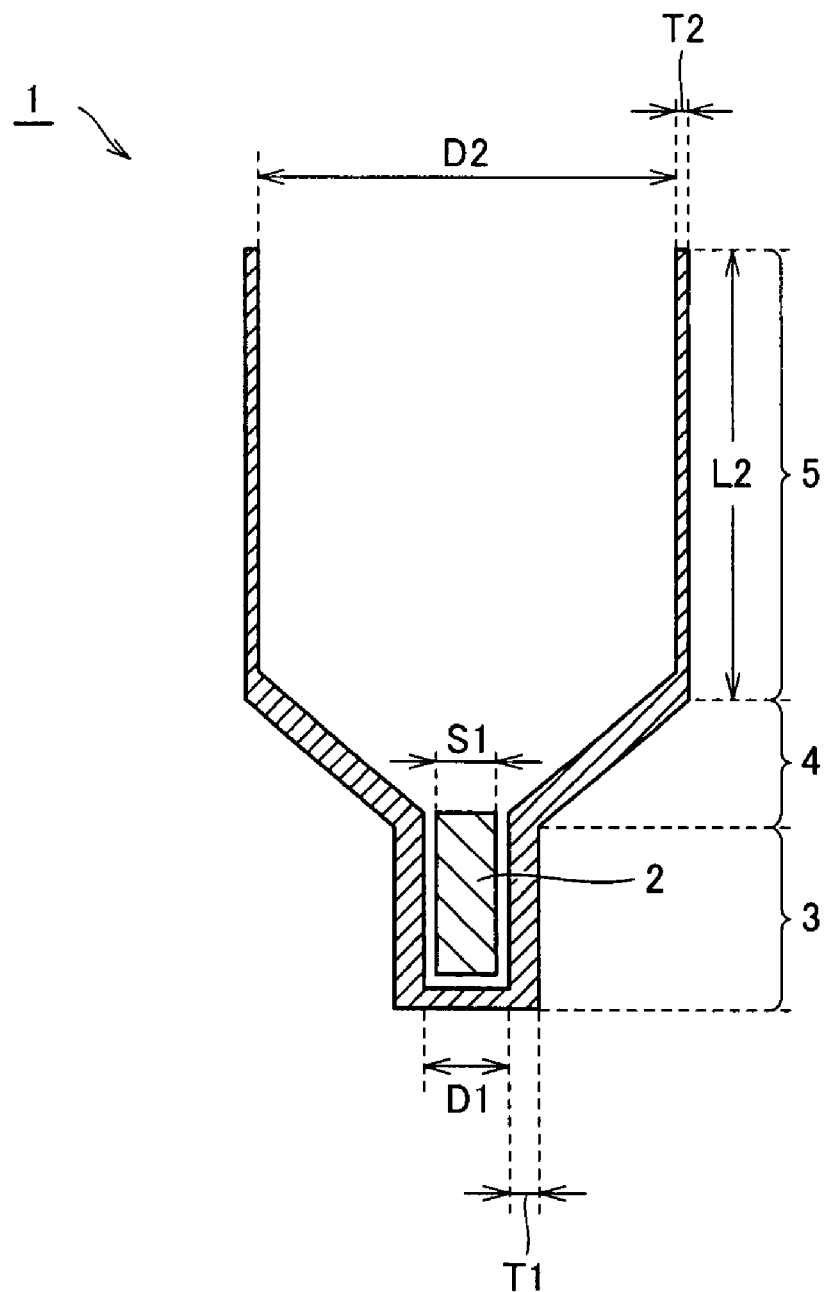
FIG. 1 is a cross-sectional view showing an exemplary crystal growth crucible according to the present invention.

1: crystal growth crucible, 2: seed crystal, 3: crucible tip portion, 4: crucible shoulder portion, 5: crucible straight-body portion, D1: inside diameter of the crucible tip portion, D2: inside diameter of the crucible straight-body portion, L2: length of the crucible straight-body portion, S1: outside diameter of the seed crystal, T1: thickness of the crucible tip portion, T2: thickness of the crucible straight-body portion. Note that the same reference characters represent the same or corresponding portions in the drawings.

BEST MODES FOR CARRYING OUT THE INVENTION

In the present invention, when the thicknesses and the inside diameters of the tip portion and the straight-body portion of the crystal growth crucible are adjusted within certain ranges, it is intended to adjust the thickness of the crucible straight-body portion which influences heat flow along peripheral part of the crystal and also adjust the thickness of the crucible tip portion which influences heat flow along central part of the crystal. By increasing the thickness of the crucible tip portion, it is possible to increase the heat flow along the central part of the crystal. Accordingly, when a thickness ratio between the crucible tip portion and the crucible straight-body portion is optimally set, a uniform temperature distribution in the cross section of the crystal is achieved during crystal growth, so that thermal stress in the crystal can be suppressed to a low level, and decrease in dislocation density can be realized.

In the case of a large crystal diameter (i.e. crucible inside diameter), however, the uniform temperature distribution cannot be realized unless influence of the side surface area of the crucible is considered. More specifically, from the relation with the temperature gradient in the single-crystal production apparatus, when the length of the crucible straight-body portion is small with respect to the inside diameter thereof, the heat flow along the peripheral part of the crystal is decreased. On the other hand, when the length of the crucible straight-body portion is large with respect to the inside diameter thereof, the heat flow along the peripheral part is increased. It is therefore desired that the length and the inside diameter fall within certain condition ranges in order to realize the uniform temperature distribution.

In the case of the crucible inside diameter being less than 100 mm, however, the temperature distribution is dominantly influenced by the ratio between the cross-sectional areas of the tip portion and the straight-body portion and less influenced by the length of straight-body portion. It is therefore substantially unnecessary to limit the range of the length.

FIG. 1 is a schematic cross-sectional view showing an exemplary crystal growth crucible according to the present invention. A boron nitride crucible 1 in FIG. 1 can roughly be divided into three parts of a tip portion 3, a straight-body portion 5, and a shoulder portion 4 connecting those two portions. The present inventor conducted crystal growth experiments by using the crucibles with wide variations of thickness T1 of the tip portion as well as thickness T2, inside diameter D2 and length L2 of the straight-body portion, while inside diameter D1 of the crucible tip portion is set to 8 mm.

Each of the crucibles was filled with a source of an amount suitable for the dimension of the crucible to grow a crystal, and then the dislocation density (the number of crystal defects) in the crystal was evaluated. As a result, it is found that even if straight-body portion inside diameter D2 of the crucible is larger than 100 mm, the number of crystal defects can be reduced as long as straight-body portion length L2 is set to fall within a certain range.

The present inventor evaluated the dislocation density also in the case that crucible tip portion inside diameter D1 was varied while T1, T2, D2, and L2 were fixed. Furthermore, the present inventor evaluated the dislocation density also in the case that difference D1-S1 between inside diameter D1 of the crucible tip portion and diameter S1 of the seed crystal was varied while T1, T2, D2, and L2 were fixed and D1 was set to 8 mm.

In order to overcome the aforementioned problem, the present inventor initially focused attention on the material and the structure of the crystal growth crucible. Then, it is found that a crystal with a low dislocation density can be grown by using an optimal crucible in which the crucible material, the crucible thickness, the inside diameter of each of the crucible tip portion and the crucible straight-body portion, the length of the straight-body portion, and the diameter of the seed crystal are considered such that the crystal is quickly cooled from its central axis part rather than from its periphery so as to reduce the temperature difference in the radial direction of the crystal during crystal growth.

Specifically, even if inside diameter D2 of the crucible straight-body portion is larger than 100 mm, a crystal with a low dislocation density can be grown as long as thickness T1 of the tip portion and thickness T2 of the straight-body portion satisfy a condition of $0.1 \text{ mm} \leq T2 < T1 \leq 5 \text{ mm}$, and length L2 of the straight-body portion and inside diameter D2 of the straight-body portion satisfy a condition of $2 < L2/D2 < 5$.

In the present invention, the anisotropy of thermal conductivity in boron nitride is utilized to reduce the temperature difference in the radial direction of the crystal. This feature will be described hereinafter in detail.

Pyrolytic boron nitride (pBN) used for material of the crucible has a hexagonal crystal structure, and its thermal conductivity significantly differs in its thickness direction and plane direction, as described below. This is because a {0001} plane (C plane) of the pBN crystal grown by pyrolysis tends to grow parallel to a substratum, and the thermal conductivity is higher in the plane direction parallel to the C plane than in the thickness direction perpendicular to the C plane. More particularly, the thermal conductivity (K) of the pBN crucible is 0.25 to 1.7 W/mK in the thickness direction and K=25 to 100 W/mK in the plane direction.

On the other hand, in the case that a crystal to be grown is a compound semiconductor, the thermal conductivity of GaAs, for example, is as follows. Specifically, GaAs of a cubic crystal system has an isotropic-thermal conductivity of K=7.3 W/mK.

Accordingly, heat flow in crystal growth by means of a pBN crucible is significantly influenced by the thickness of the crucible. More specifically, if the thickness of the crucible is decreased, the heat flow rate along the plane direction of the crucible is decreased and the lower thermal conductivity in the thickness direction becomes dominant, so that heat dissipation in the radial direction of the crystal is suppressed. In contrast, if the thickness of the crucible is increased, the higher thermal conductivity in the plane direction of the crucible becomes dominant and then the periphery of the crystal is cooled, so that heat dissipation in the radial direction of the crystal is enhanced.

In the present invention, thickness D1 of the crucible tip portion is made large, while thickness D2 of the crucible straight-body portion is made small, so that heat is dissipated downwardly along the central axis of the crystal, and heat dissipation toward the crystal periphery in the radial direction of the crystal can be suppressed.

Furthermore, in order to uniformly control the heat flow also in consideration of the thermal conductivity of the crystal to be grown in the present invention, it is effective to set the cross-sectional areas (inside diameters) of the crucible tip portion and the crucible straight-body portion to a certain appropriate ratio. Specifically, inside diameter D1 of the crucible tip portion and inside diameter D2 of the crucible straight-body portion are set to satisfy a relation of $1/20 \leq D1/D2 \leq 1/5$, whereby the heat flow can be controlled uniformly.

Furthermore, in order to control the heat flow toward the crucible tip portion in the present invention, it is preferable to adjust the gap between the seed crystal and the crucible tip portion so as to suppress heat transfer resistance at the gap. In other words, the gap between the seed crystal and the inside wall of the crucible tip is made small, so that the heat flow is further enhanced and heat can be dissipated through the central axis part of the crystal.

Specifically, inside diameter D1 of the crucible tip portion and outside diameter S1 of the seed crystal are set to satisfy a relation of $0.01$ mm $\leq D1-S1 \leq 1$ mm at a room temperature, whereby the heat flow through the crucible tip portion can be enhanced. The reason why D1-S1 should be not more than 1 mm is that the gap larger than that inhibits favorable heat conduction from the seed crystal to the crucible tip portion. On the other hand, the reason why D1-S1 should be at least 0.01 mm is that the gap smaller than that hinders easy loading of the seed crystal into the crucible tip portion and requires higher dimensional processing accuracy which results in higher cost.

EXAMPLE 1

Figure 7:
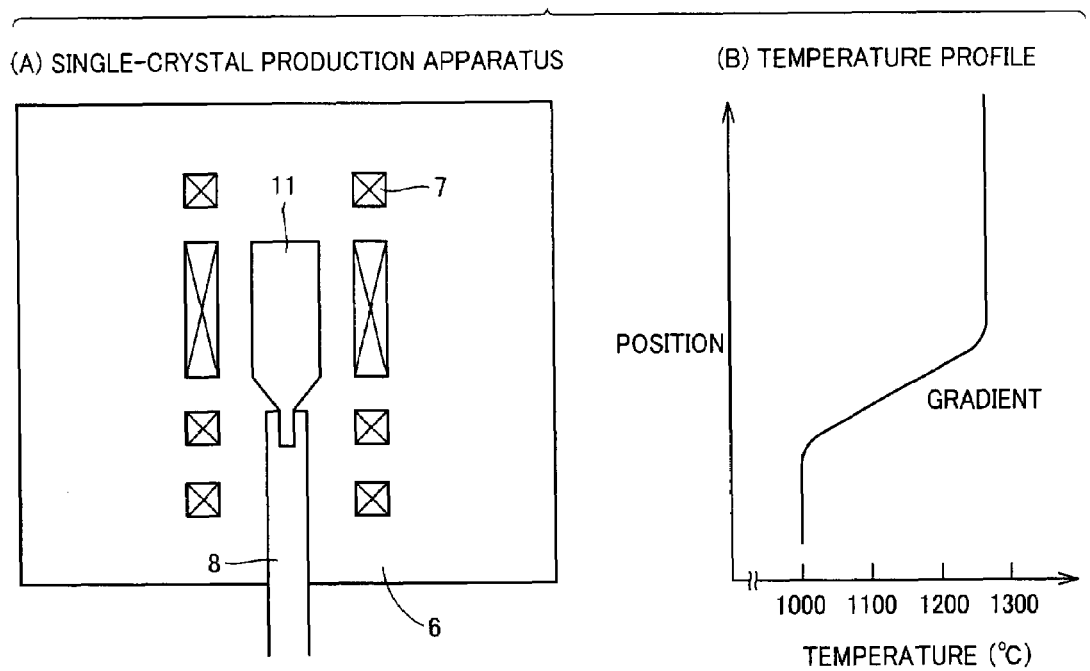
FIG. 7(A) is a schematic block diagram showing an exemplary crystal production apparatus and FIG. 7(B) is a graph showing a temperature profile in this production apparatus.

A GaAs crystal growth experiment was conducted with use of a crucible as shown in FIG. 1 in the crystal production apparatus shown in FIG. 7(A), as follows. In the crystal growth experiment, the crucible was initially filled with a GaAs source of an amount suitable for inside diameter D2 and length L2 of the straight-body portion of the crucible, along with a proper amount of Si serving as a dopant. The growth rate was 8 mm/hr, and the temperature gradient in the temperature profile shown in FIG. 7(B) was 10° C./cm in the vicinity of the growth position.

As to the crucible used in the experiment, inside diameter D1 of the tip portion was set to 8 mm. There were used seed crystals having their diameters in a range of 7.4 mm to 7.8 mm. Under the condition that wall thickness T1 of the crucible tip portion and wall thickness T2 of the crucible straight-body portion satisfied the relation of $0.1$ mm $\leq T2 < T1 < 5$ mm, a single crystal was grown in each of the crucibles with inside diameter D2 and length L2 of the straight-body portion varied widely. Then, three wafers were subsequently cut from each of the grown crystals, and the number of dislocations per unit area was determined at nine measurement areas in each of the wafers to determine the mean dislocation density in each crystal. The results are shown in FIG. 2.

Figure 2:
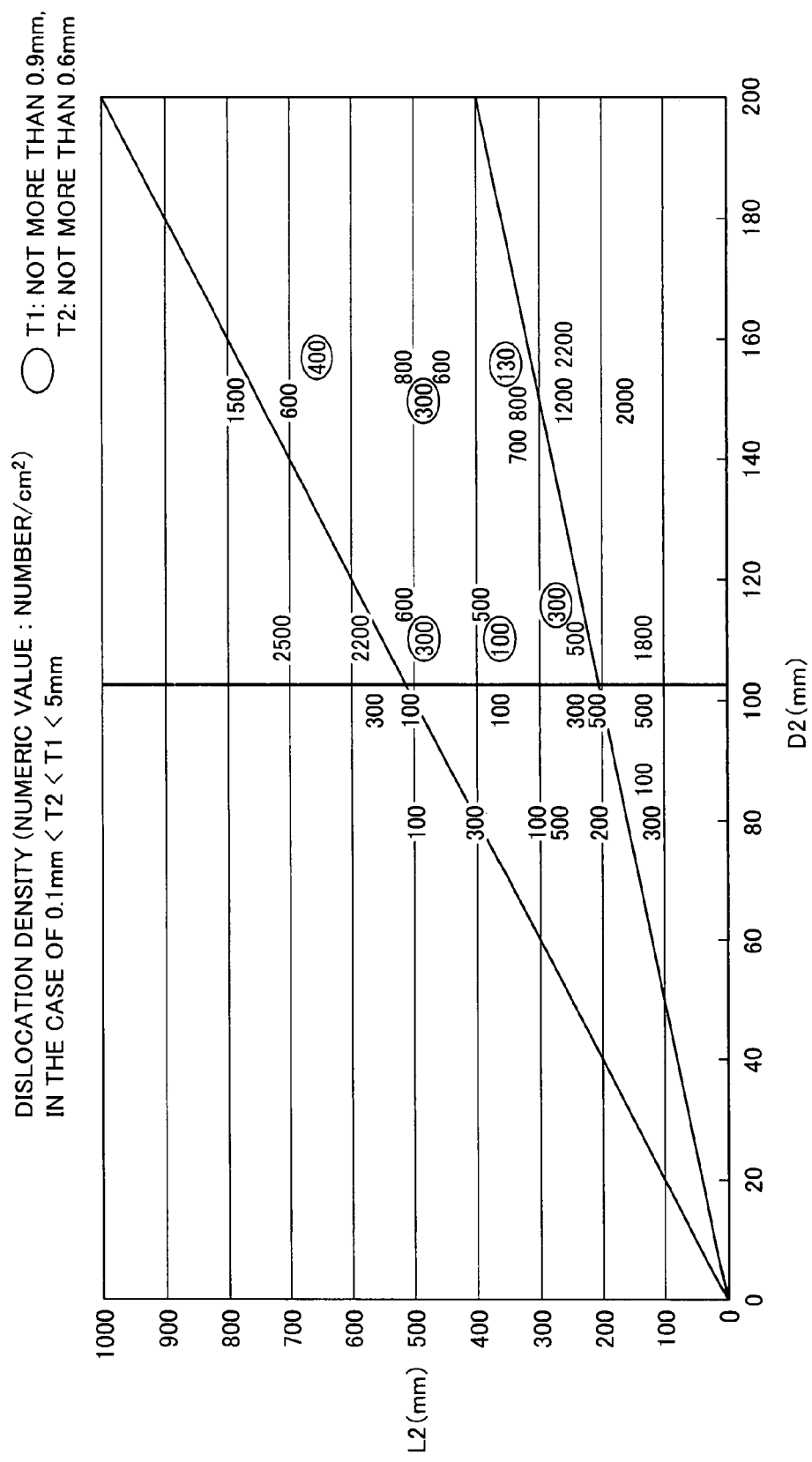
FIG. 2 is a graph showing the mean dislocation density under the influence of inside diameter $D_2$ and length $L_2$ of the crucible straight-body portion, in relation to the present invention.

In the graph of FIG. 2, a horizontal axis represents inside diameter D2 (mm) of the crucible straight-body portion, while a vertical axis represents length L2 (mm) of the straight-body portion. The numeric values in the graph represent the dislocation densities (number/cm$^2$). As is clear from FIG. 2, under the condition of $0.1$ mm $\leq T2 < T1 \leq 5$ mm, when inside diameter D2 of the straight-body portion is in the range exceeding 100 mm, the dislocation density can be decreased to less than 1000/cm$^2$ in the range satisfying the condition of $2 < L2/D2 < 5$. Incidentally, the upper thickness limit of the crucible is 5 mm, since the thickness larger than that increases the cost of the crucible and has little influence on the dislocation density. On the other hand, the lower thickness limit of the crucible is 0.1 mm from the technical reason of production. Although it is possible to form a pBN crucible having a thickness less than 0.1 mm by providing a protective container made of quartz, carbon or the like outside the crucible, such an experiment was not conducted at this time.

Each numeric value surrounded by an oval mark in the graph of FIG. 2 represents the dislocation density obtained when the crucible further satisfies the conditions of $T1 \leq 0.9$ mm and $T2 \leq 0.6$ mm, under the condition that $0.1$ mm $\leq T2 < T1 \leq 5$ mm. In such a case, it is possible to obtain a crystal with an extremely low dislocation density of less than 500/cm$^2$. Incidentally, when the thickness of the crucible is sufficiently reduced, the influence of the thermal conductivity of the crystal rather than the crucible is more dominant, and thus even if the difference between T1 and T2 is not so large, the dislocation density can be reduced. In order to circumvent problems of cracks and others when the crucible is handled, however, the lowest thickness limit of the crucible is 0.1 mm.

Figure 3:
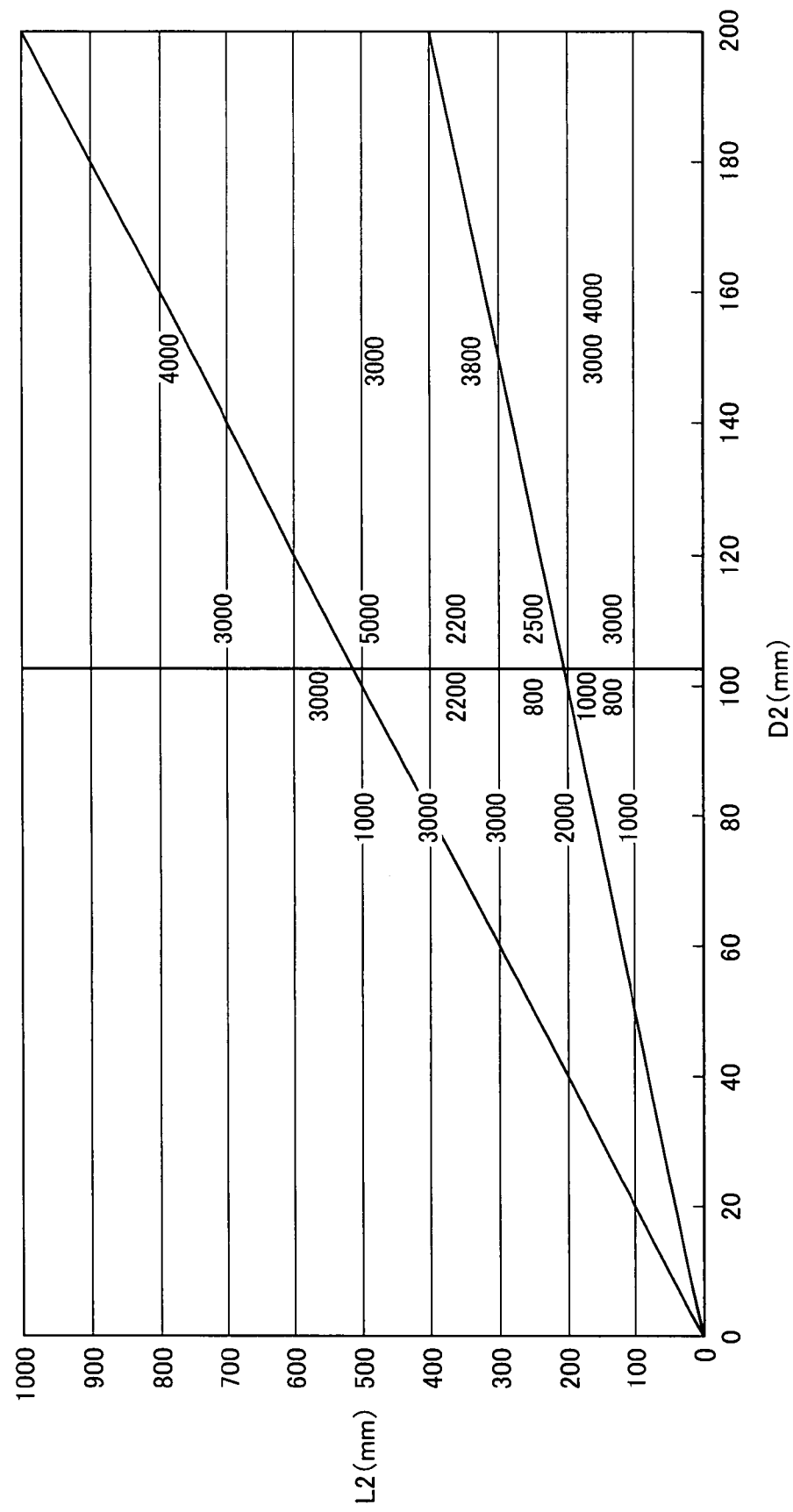
FIG. 3 is a graph showing the mean dislocation density under the influence of inside diameter $D_2$ and length $L_2$ of the crucible straight-body portion, in relation to reference examples.

Although a graph of FIG. 3 is similar to that of FIG. 2, it shows the dislocation density when the condition of $0.1$ mm $\leq T2 < T1 \leq 5$ mm is not satisfied, for reference. As seen from the graph of FIG. 3, even in the range where the condition of $2 < L2/D2 < 5$ is satisfied, the dislocation density cannot be reduced to 2000/cm$^2$ or lower in the range where inside diameter D2 of the crucible straight-body portion is larger than 100 mm.

Next, inside diameter D2 of the straight-body portion was fixed to 110 mm, and thickness T1 of the crucible tip portion was set in a range of 0.7 to 0.9 mm, while thickness T2 and length L2 of the straight-body portion were set in a range of 0.4 to 0.6 mm and to 240 mm, respectively. Under these conditions, inside diameter D1 of the tip portion was widely varied to examine the influence thereof on the dislocation density. Here, the difference between inside diameter D1 of the crucible tip portion and outside diameter S1 of the seed crystal was made smaller within 1 mm. The results of the examination are shown in FIG. 4.

Figure 4:
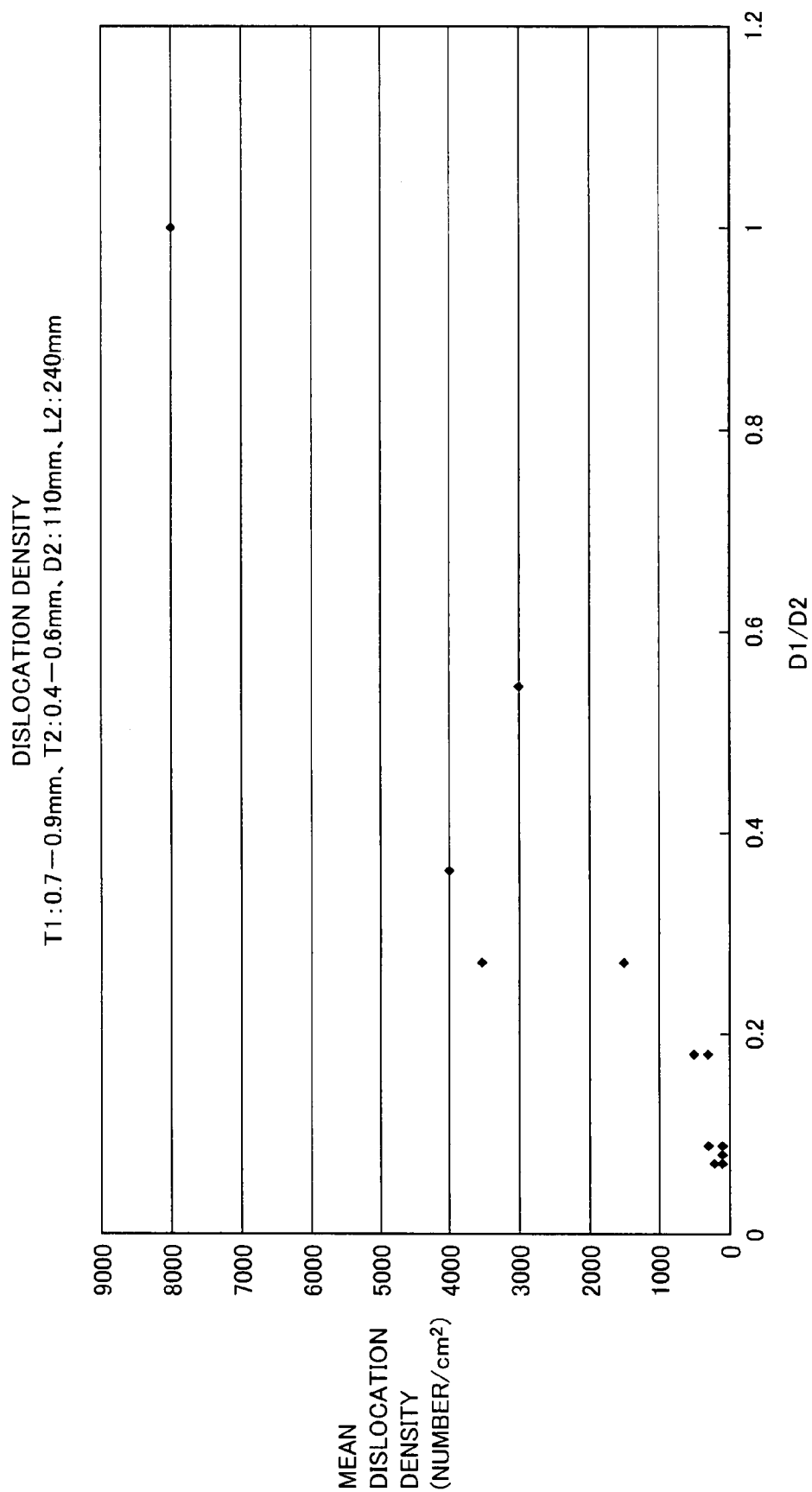
FIG. 4 is a graph showing the mean dislocation density under the influence of ratio D1/D2 between inside diameter D1 of the crucible tip portion and inside diameter D2 of the crucible straight-body portion.

In the graph of FIG. 4, a horizontal axis represents the ratio D1/D2 between inside diameter D1 of the tip portion and inside diameter D2 of the straight-body portion, while a vertical axis represents the mean dislocation density (number/cm$^2$). As is clear from the graph of FIG. 4, ratio D1/D2 between inside diameter D1 of the crucible tip portion and inside diameter D2 of the crucible straight-body portion has a moderate correlation with the dislocation density, and it is possible to obtain a crystal with a low dislocation density of 1000/cm$^2$ in the range of $D1/D2 \leq 1/5$. In view of the possible smallest diameter of the seed crystal, however, inside diameter D1 of the tip portion is desired to fall within the range of $1/20 \leq D1/D2$.

Furthermore, as to the gap between the inside wall of the crucible tip portion and the seed crystal, which is problematic in terms of thermal contact resistance, the following experiment was also conducted. Inside diameter D2 and thickness T2 of the crucible straight-body portion were set to 110 mm and in a range of 0.4 to 0.6 mm, respectively, and inside diameter D1 and thickness T1 of the tip portion were set to 8 mm and in a range of 0.7 to 0.9 mm, respectively. Under these conditions, outside diameter S1 (mm) of the seed crystal was varied to examine the influence thereof on the dislocation density of the grown crystal. The results are shown in FIG. 5.

Figure 5:
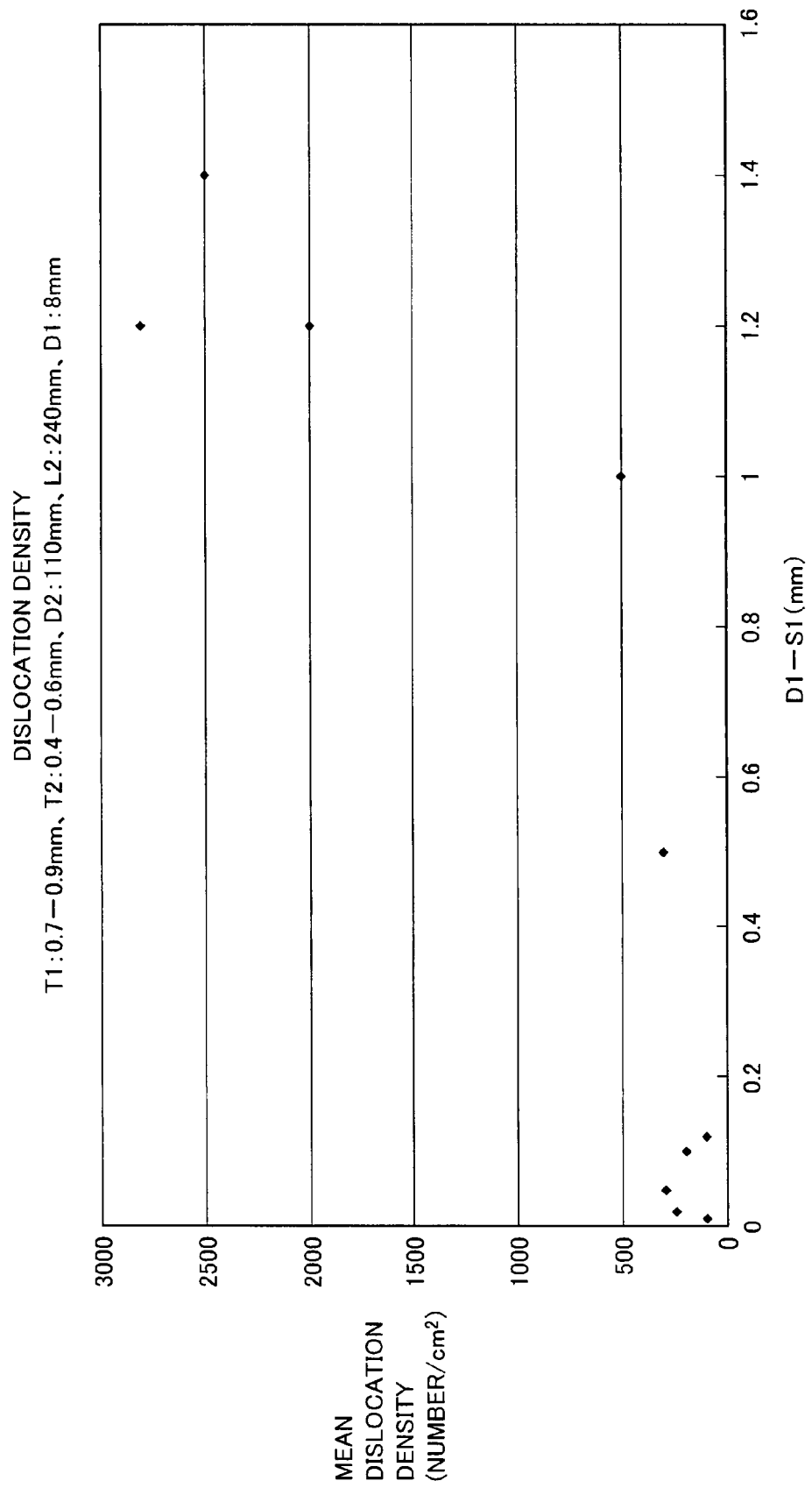
FIG. 5 is a graph showing the mean dislocation density under the influence of difference D1-S1 between the inside diameter of the crucible tip portion and the outside diameter of the seed crystal.
Figure 6:
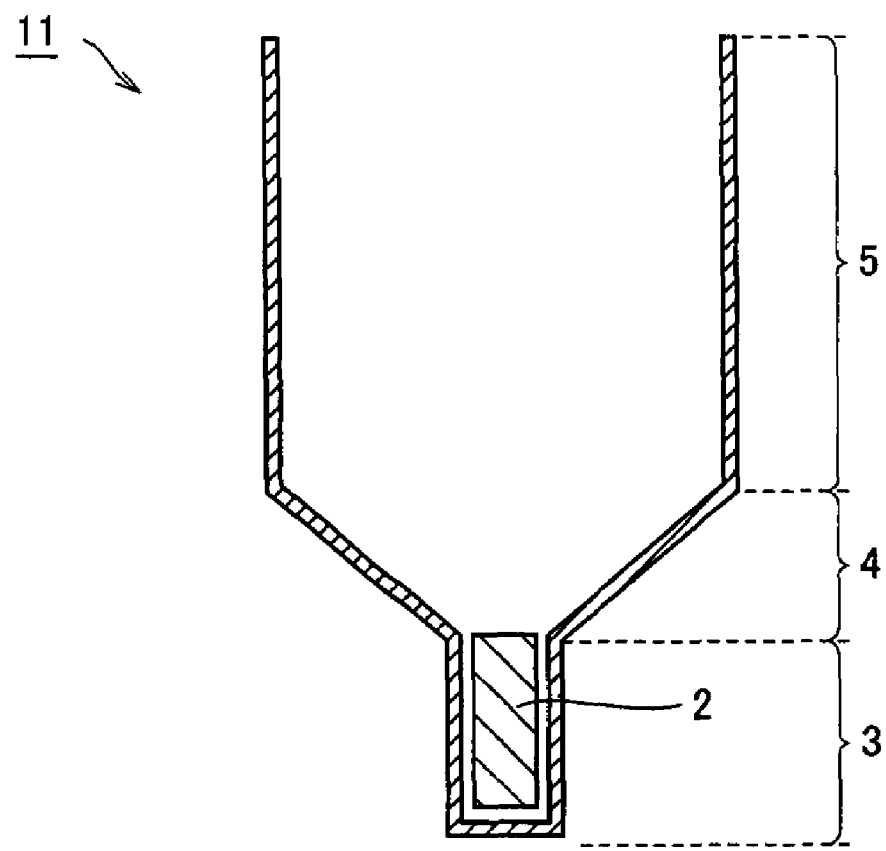
FIG. 6 is a schematic cross-sectional view showing an exemplary crucible for use in the conventional VB method.

In the graph of FIG. 5, a horizontal axis represents the difference D1-S1 (mm) between inside diameter D1 of the crucible tip portion and outside diameter S1 of the seed crystal, while a vertical axis represents the mean dislocation density (number/cm$^2$). As is clear from the graph of FIG. 5, it is possible to stably obtain a crystal with a low dislocation density of less than 1000/cm$^2$, by making the gap D1-S1 between the inside wall of the crucible tip portion and the seed crystal smaller within 1 mm. On the other hand, the gap made smaller within 0.01 mm hinders easy loading of the seed crystal into the crucible tip portion and requires higher dimensional processing accuracy that results in undesirable higher cost. Accordingly, the gap D1-S1 between the inside diameter of the crucible tip portion and the seed crystal preferably satisfies a condition of 0.01 mm$\leq$D1-S1$\leq$1 mm.

INDUSTRIAL APPLICABILITY

As described above, according to the present invention, it is possible to provide a large-diameter crystal with a low dislocation density as compared with the conventional example, by adjusting the thicknesses, the inside diameters, the lengths and the like of the tip portion and the straight-body portion of the crystal growth crucible within certain ranges and certain relations.

The invention claimed is:

1. A crystal growth crucible made of boron nitride, comprising: a cylindrical tip portion for accommodating a seed crystal; and a cylindrical straight-body portion for growing a crystal, which is formed above said tip portion and has a diameter larger than that of said tip portion, wherein
    thickness T1 of said tip portion and thickness T2 of said straight-body portion satisfy a condition of 0.1 mm$\leq$T2<T1$\leq$5 mm, and
    inside diameter D2 and length L2 of said straight-body portion satisfy conditions of 100 mm<D2 and 2$\leq$L2/D2<5.

2. The crystal growth crucible according to claim 1, wherein thickness T1 of said tip portion and thickness T2 of said straight-body portion satisfy conditions of T1$\leq$0.9 mm and T2$\leq$0.6 mm.

3. The crystal growth crucible according to claim 1, wherein inside diameter D1 of said tip portion and inside diameter D2 of said straight-body portion satisfy a condition of 1/20$\leq$D1/D2$\leq$1/5.

4. The crystal growth crucible according to claim 1, wherein inside diameter D1 of said tip portion and outside diameter S1 of said seed crystal satisfy a condition of 0.01 mm$\leq$D1-S1$\leq$1 mm at a room temperature.

* * * * *

UNITED STATES PATENT AND TRADEMARK OFFICE
CERTIFICATE OF CORRECTION

PATENT NO. : 7,473,317 B2  Page 1 of 1
APPLICATION NO. : 11/884836
DATED : January 6, 2009
INVENTOR(S) : Yoshiaki Hagi It is certified that error appears in the above-identified patent and that said Letters Patent is hereby corrected as shown below:

On the title page of the patent,

In Item "(86) PCT No.:", change "PCT/JP2006/004562" to --PCT/JP2006/304562--.

Signed and Sealed this

Eleventh Day of August, 2009

David J. Kappos
*Director of the United States Patent and Trademark Office*